(12) United States Patent
Comer et al.

(10) Patent No.: US 6,927,713 B2
(45) Date of Patent: *Aug. 9, 2005

(54) RESPONSE-BASED ANALOG-TO-DIGITAL CONVERSION APPARATUS AND METHOD

(75) Inventors: Donald T. Comer, West Mapleton, UT (US); Darren S. Korth, Lehi, UT (US)

(73) Assignee: UltraDesign, LLC, Lindon, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/826,239

(22) Filed: Apr. 16, 2004

(65) Prior Publication Data

US 2004/0263374 A1 Dec. 30, 2004

Related U.S. Application Data

(63) Continuation of application No. 10/421,129, filed on Apr. 23, 2003, now Pat. No. 6,816,096.

(51) Int. Cl.[7] ............................................... H03M 1/20
(52) U.S. Cl. ...................................... 341/131; 341/120
(58) Field of Search ................................ 341/131, 120, 341/118

(56) References Cited

U.S. PATENT DOCUMENTS

| | | | |
|---|---|---|---|
| 4,621,254 A | 11/1986 | Belcher | 340/347 |
| RE34,660 E | 7/1994 | Belcher | 341/144 |
| 5,990,814 A | 11/1999 | Croman et al. | 341/118 |
| 6,127,956 A | 10/2000 | Agi | 341/131 |
| 6,563,862 B1 * | 5/2003 | Knutson et al. | 375/219 |
| 2003/0197631 A1 * | 10/2003 | Comer et al. | 341/131 |

* cited by examiner

*Primary Examiner*—Peguy JeanPierre
*Assistant Examiner*—Joseph Lauture
(74) *Attorney, Agent, or Firm*—Steven F. McDaniel

(57) ABSTRACT

An apparatus and method for increasing the resolution of analog-to-digital conversion devices and systems is described. The described apparatus and method operate without significantly increasing the complexity or conversion time of conventional analog-to-digital conversion architectures. The improved resolution is accomplished by detecting the time-dependent response characteristics of comparators used within an analog-to-digital converter. The detected response characteristics, such as the response pattern or the response time, are used to estimate the overdrive voltage on the comparator of interest and to thereby provide additional bits to the analog-to-digital conversion process. In those applications where the response characteristics affect the settling characteristics of the converter output bits, additional resolution may be attained by detecting the settling characteristics, such as the settling pattern or settling time, of the converter output bits, particularly the least significant bit.

8 Claims, 7 Drawing Sheets

RESPONSE-BASED ANALOG-TO-DIGITAL CONVERSION APPARATUS AND METHOD

CROSS-REFERENCES TO RELATED APPLICATIONS

This application is a continuation of and claims priority to U.S. patent application Ser. No. 10/421,129 is now a U.S. Pat. No. 6,816,096, entitled "Response-Based Analog-To-Digital Conversion Apparatus and Method and filed on Apr. 23, 2003 for Donald T. Comer and Darren S. Korth, which is incorporated herein by reference.

BACKGROUND OF THE INVENTION

1. Field of the Invention

This invention relates to devices, methods, and systems for conducting analog-to-digital conversions. Specifically, the invention relates to devices, methods, and systems for conducting analog-to-digital conversions using analog comparators.

2. Description of the Related Art

A flash or parallel analog-to-digital (A/D) converter is useful for high-speed applications due to its single clock cycle conversion capability. Typical applications include data acquisition, video capture, video compression, and the like.

The architecture for a classical flash A/D converter is described in a variety of tutorial sources, including D. A. Johns and K. Martin, *Analog Integrated Circuit Design*, John Wiley and sons, New York, 1997, chapter 13. As depicted in FIG. 1, a classic A/D architecture 100 for a parallel A/D converter employs a resistor string 110, a comparator bank 120, a digital encoder 125, and an output register 150. In the depicted architecture, the digital encoder 125 comprises a one-high encoder 130 and a binary encoder 140. As depicted, conversion of an analog input signal (not shown) begins on the rising edge of a conversion clock 102. A delayed version of the conversion clock 102 is provided by the delay element 170 as the delayed conversion clock 172. In the depicted embodiment, the delayed conversion clock 172 is used to latch the digital code 142 into the output register 150 and complete the analog-to-digital conversion cycle. While the depicted architecture illustrates a digital encoder 125 that provides binary codes, the digital encoder 125 may be configured to provide other codes such as Grey codes.

The schematic diagram of FIG. 2 illustrates in greater detail a 3-bit example of the classical A/D architecture 100. The depicted example requires seven single-bit comparators 220 within the comparator bank 120 to produce three digital output bits within the digital code 142. The digital encoder 125 translates the output signals from the seven single bit comparators 220 to the three-bit digital code 142. In general, classical flash architectures require $2^N-1$ comparators and associated logic gates to produce an output of N digital bits. Thus, the complexity, cost, and power consumption of a flash converter is typically proportional to $2^N-1$.

The reference inputs for the comparators 220 are preferably biased by a monotonically increasing series of reference voltages 112. For example, the reference voltages may be provided by a set of resistors arranged in series within the resistor string 110 such that the reference voltages 112 range from a near zero value at the first comparator to a maximum value at the last comparator.

Each of the comparators 220 compares an input signal, such as the input signal 202, with one of the reference voltages 112. In the depicted embodiment, the comparators begin each conversion cycle with their output at a low voltage corresponding to a binary zero state. Conversion commences with the rising edge of the conversion clock 102. Those comparators that are provided with reference voltages lower than the input signal 202 drive their corresponding output to a high voltage, while the remaining comparators maintain their outputs at a low voltage.

In the depicted configuration, the outputs of the comparators 220 provide what is sometimes referred to as a "thermometer" code in that all outputs above a transition point have a low value, while those outputs below the transition point have a high value. The provided thermometer code is typically applied to a set of logic gates such as those shown within the one-high encoder 130 of FIG. 2. The logic gates convert the thermometer code to a "one high" code in which the high valued bit corresponds to the transition point. The "one high" digital code is then applied to additional logic such as the depicted binary encoder 140 to produce the digital code 142.

Due to the exponential increase in complexity associated with additional resolution, commercial flash A/D converters are typically limited to 8 or fewer bits of resolution. For example, an 8-bit flash A/D converter would require 255 comparators. Increasing the resolution to 10-bits would require 1023 comparators or a four-fold increase over an 8-bit converter.

In addition to an exponential increase in the number of comparators, additional resolution typically requires higher precision components to match the increased resolution. For example, the transistors that comprise the comparators may require tighter width-to-length ratio tolerances to achieve the desired precision. Tighter tolerances on transistor dimensions are typically accomplished by increasing the overall size of the transistors. Increasing the transistor sizes further increases the exponential growth in both circuit area and power consumption.

Due to the challenges and barriers to increasing conversion resolution, A/D converter designers have sought solutions to the problem and have devised some possible solutions. The idea of "interpolation," as discussed in chapter 13 of Johns and Martin, *Analog Integrated Circuit Design,* is one such solution. As discussed therein, prior art interpolating converters interpolate the output of the amplifier stages of adjacent comparators, using for example a voltage divider circuit to provide additional inputs into the latching stages.

Voltage or current interpolation potentially simplifies comparator circuitry used within a typical flash converter. Although practical, voltage or current interpolation has several disadvantages. For example, currently available interpolation techniques typically require amplifiers that exhibit a linear response for small input signals. Requiring a linear response further constrains the comparator circuit, often resulting in less than optimal speed. Another disadvantage of currently available interpolation techniques is the need for linear summing of the amplifier stage output signals. Linear summing is normally accomplished by resistors or capacitors, which adds complexity and presents precision matching challenges.

Another method for reducing the number of comparators required for additional resolution is to use a "folding" technique. A folding technique facilitates using the same comparator for multiple levels of signal input. The folding technique is discussed in Johns and Martin as well as in U.S. Pat. No. 6,169,510. Comparator reuse requires the addition of very precise folding circuits to process the input signal and in some cases may result in a reduction of A/D converter accuracy due to either static or dynamic errors introduced by the folding circuits. Other less general methods have been proposed such as using a second "ranging" comparator and digital select logic. This approach requires additional complexity and additional time for a conversion to take place. Yet another widely used approach to reducing the number of comparators is the two-stage flash (flash-flash) architecture, which generates N digital bits in two separate clock cycles. A variation of the classical flash-flash architecture is the subranging architecture, which also requires two clock cycles for a complete conversion. Two stage and subranging A/D converter architectures are described in chapter 13 of Johns and Martin.

What is needed is an apparatus and method to increase the resolution of A/D conversions without an exponential increase in circuit complexity and other limitations imposed by current techniques. Such an increased resolution needs to be implemented in a manner that does not interfere with a flash converter's ability to convert within a single clock cycle.

SUMMARY OF THE INVENTION

The apparatus and methods of the present invention has been developed in response to the present state of the art, and in particular, in response to the problems and needs in the art that have not yet been fully solved by currently available analog-to-digital conversion means and methods. Accordingly, it is an overall object of the present invention to provide an improved apparatus and method for conducting analog-to-digital conversions.

To achieve the foregoing object, and in accordance with the invention as embodied and broadly described herein in the preferred embodiments, an improved resolution apparatus and method are presented for conducting analog-to-digital conversions. The improved apparatus and method facilitate increased conversion resolution while minimizing complexity and additional conversion delays.

In a first aspect of the present invention, a response-based interpolation apparatus and method leverages the time-dependent response characteristics of a comparator to provide additional conversion resolution. The response-based interpolation apparatus and method provide additional conversion resolution without the voltage-division or current-division circuitry required of currently available interpolation techniques.

In a second aspect of the invention, another response-based interpolation apparatus and method provide additional conversion resolution by monitoring the digital outputs typically provided by a digital encoder of an analog-to-digital converter. Monitoring the digital outputs is effective in that the settling characteristics of the outputs reflect the time-dependent response characteristics of the comparators that drive the digital logic within a converter.

Various single-bit and multi-bit embodiments of the response-based interpolation are presented including response-pattern, response-time, settling-pattern and settling-time embodiments. The various embodiments leverage the relationship between input overdrive voltage and time-dependent comparator response characteristics to provide additional bits of conversion resolution.

A response-time interpolator includes a timer and a time-to-voltage mapper. Timing commences with the appropriate transition of the main conversion clock. Timing terminates with a transition of a comparator output signal. The measured (comparator) response time is mapped to an input overdrive voltage to provide additional conversion resolution.

A response-pattern interpolator includes one or more delay elements that provide delayed versions of the main conversion clock. The delayed clock signals are used to strobe one or more latches at selected intervals and thereby digitally sample the output of a comparator. The sampled values preferably capture the comparator output at intervals corresponding to the response time of selected overdrive voltages. In one embodiment, the sampled values essentially provide an overdrive voltage thermometer code and are used to encode additional bits of conversion resolution. A single-bit version that requires no binary encoding may be embodied using a single delay element and a latch.

Various single-bit and multi-bit embodiments of response-based interpolation are also presented that focus on the effect of comparator response on the digital outputs of converters. The various embodiments estimate the overdrive voltage of comparators used within analog-to-digital converters by detecting the settling characteristics of digital outputs such as settling-time or settling-patterns. The described settling-time and settling-pattern embodiments are similar to the presented response-time and response-pattern embodiments, but are optimized to operate on the digital outputs of converters.

The present invention offers additional conversion resolution without requiring additional analog circuitry such as comparators, voltage dividers, and current dividers. With the exception of delay elements, additional high precision components are not required. The simplicity and effectiveness of the invention facilitate deployment within both new and existing analog-to-digital conversion devices and systems. These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

Figure 3A:
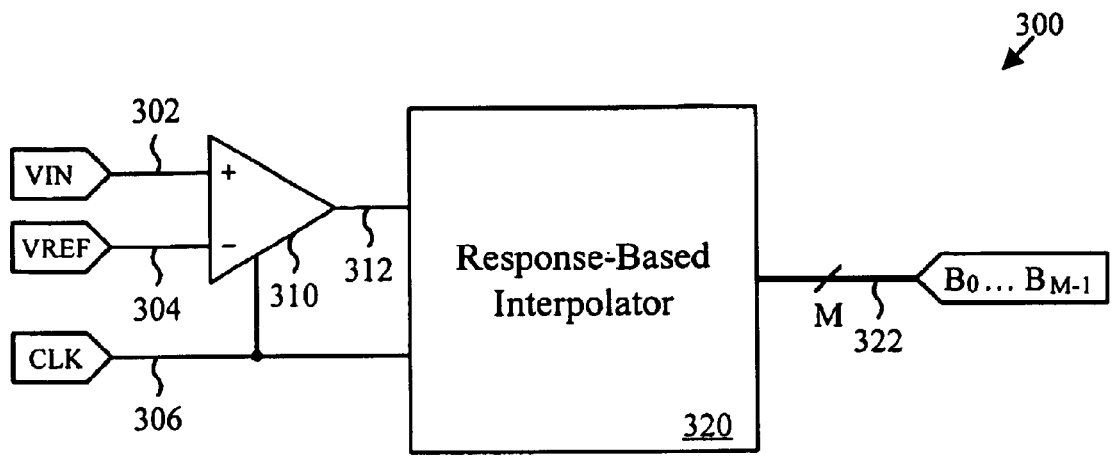
FIG. 3a is a block diagram illustrating a response-based interpolation apparatus of the present invention.

Referring to FIG. 3a, an overdrive estimator 300 addresses many of the problems and issues inherent in the prior art analog-to-digital conversion resolution enhancement techniques as discussed in the background section herein. The overdrive estimator 300 includes a comparator 310 and a response-based interpolator 320.

The comparator 310, typical of comparators used within A/D converters, receives an input signal 302 and a reference signal 304. The comparator 310 may also receive a conversion clock 306. The comparator 310 provides a response signal 312 based on the relative voltages of the input signal 302 and the reference signal 304. As depicted, the comparator 310 provides a high voltage (a logic one state) when the input signal 302 is greater than the reference signal 304 and a low voltage (a logic zero state) when the input signal 302 is less than the reference signal 304. The conversion clock or latch signal 306 may be used to control the timing of comparisons and responses. Between conversions, the comparator 310 preferably returns to a default low-voltage state.

The response-based interpolator 320 receives the response signal 312 and provides one or more additional bits 322. The additional bits 322 may be used to augment other bits provided by a flash A/D converter or to provide conversion bits in conjunction with other comparator-based A/D techniques such as successive approximation or sigma-delta modulation. The additional bits 322 are provided by detecting the time-dependent response characteristics of the response signal 312, such as the response pattern or response time, and estimating the relative voltages of the input signal 302 and the reference signal 304.

Figure 3B:
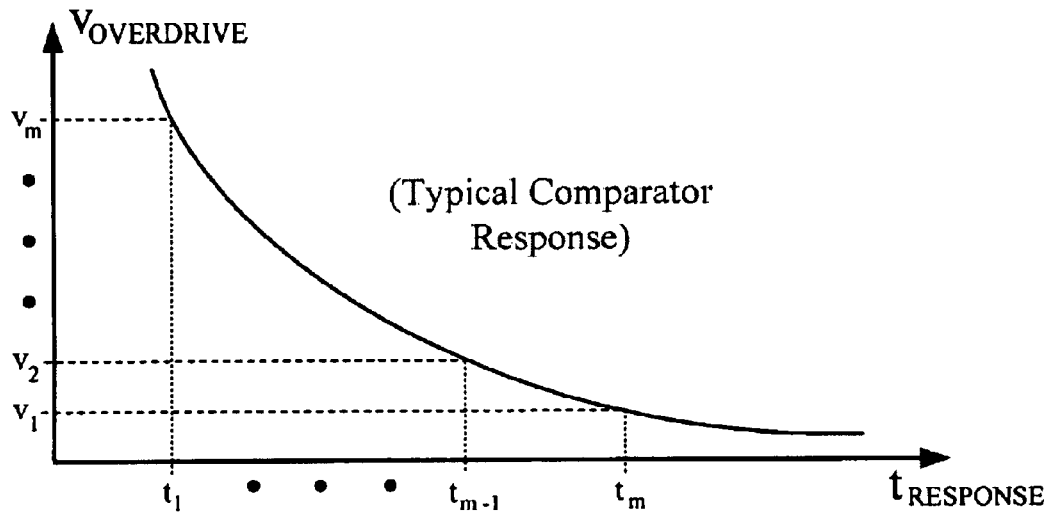
FIG. 3b is a graph depicting the relationship of comparator response time to voltage overdrive for a typical comparator.
Figure 3C:
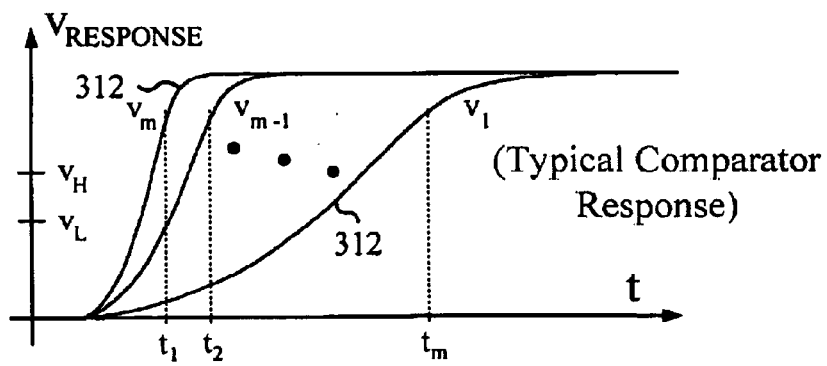
FIG. 3c is a graph depicting several output response curves for a comparator overdriven at various voltages.

FIG. 3b illustrates a typical relationship between the response time of a comparator and the relative voltages of the input signal 302 and the reference signal 304. The depicted relationship is shown for a positive relative voltage known as an overdrive voltage, where the input voltage is slightly higher than the reference voltage. FIG. 3b shows the inverse relationship between comparator response time and comparator overdrive voltage. FIG. 3c shows various response curves of the response signal 312 corresponding to selected overdrive voltages $v_1 \ldots v_m$ for a typical comparator.

The graphs shown in FIGS. 3b and 3c illustrate that the response signal 312 rises proportional to the overdrive voltage such that higher overdrive voltages result in shorter response times and faster rising response curves. Although depicted as a damped signal in FIG. 3c, the response signal 312 may be less well-behaved. For example, the response signal 312 may overshoot, or it may exhibit more complex behavior. The response-based interpolator 320 preferably uses the time-dependent response characteristics of the comparator 310 to estimate the overdrive voltage. In one embodiment, the response characteristics of the comparators are derived from models and are used to calculate key parameters for detecting and/or estimating the overdrive voltage. In another embodiment, representative response characteristics such as response times or patterns are collected for various overdrive voltages during a calibration sequence.

Figure 4A:
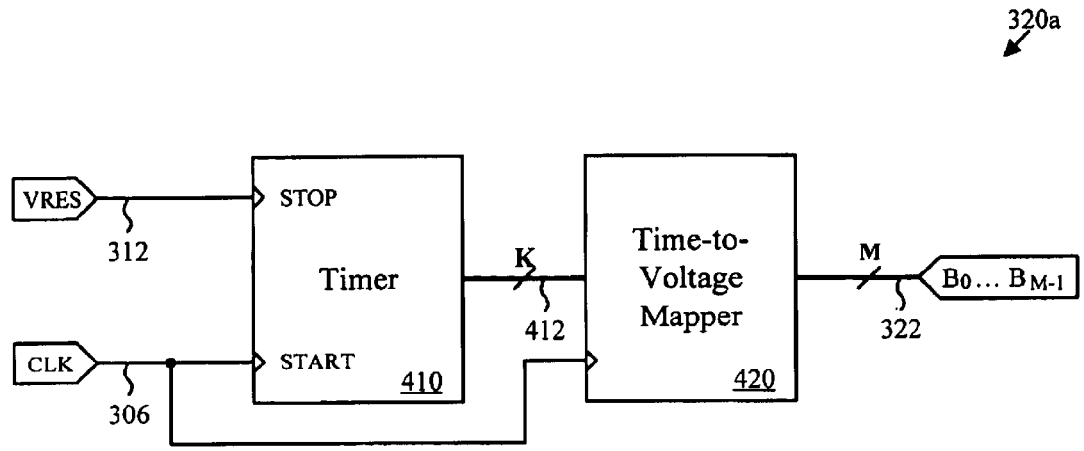
FIG. 4a is a schematic block diagram illustrating one embodiment of a response-time interpolator of the present invention.

Referring to FIG. 4a, one embodiment of a response-time interpolator 320a, suitable for use as the response-based interpolator 320 of FIG. 3a, includes a timer 410 and a time-to-voltage mapper 420. The timer 410 receives a clock or timing signal such as the conversion clock 306. Timing commences with the appropriate transition or level of the conversion clock 306, which in the depicted embodiment is a low-to-high clock transition. Timing terminates with a transition of a comparator output signal such as the response signal 312. In the depicted embodiment, timing terminates with a low-to-high transition of the response signal 312. The timer 410 accumulates a K-bit response time 412 and provides that time to the time-to-voltage mapper 420.

The time-to-voltage mapper 420 receives the response time 412 and provides the additional bits 322. In one embodiment the time-to-voltage mapper 420 comprises a semiconductor memory that is initialized with calibration data during a calibration cycle. In another embodiment the time-to-voltage mapper comprises a ROM containing a hard-coded mapping function. Other possible embodiments include hard-coded logic, programmable logic and software lookup tables. The depicted response-time interpolator 320a while flexible, may not be suitable for certain high speed applications in that the timer 410 must operate at a higher internal clock rate than the conversion clock 306.

Figure 4B:
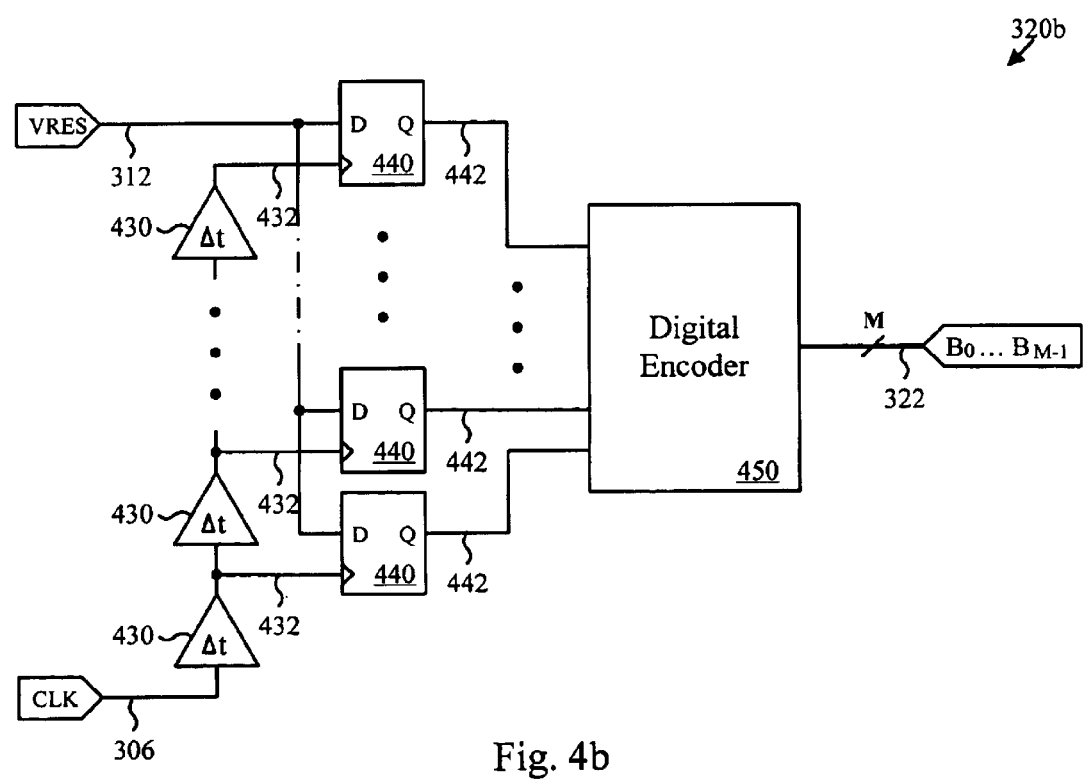
FIG. 4b is a schematic block diagram illustrating one embodiment of a response-pattern interpolator of the present invention.

Referring to FIG. 4b, a response-pattern interpolator 320b includes one or more delay elements 430 in conjunction with one or more latches 440. The delay elements 430 provide delayed versions 432 of the conversion clock 306. The delayed clock signals 432 are used to strobe the latches 440 and thereby digitally sample a signal such as the response signal 312. The sampled values stored in the latches 440 preferably capture a comparator output (response) signal at intervals corresponding to the response time of selected overdrive voltages such as those shown in FIGS. 3b and 3c.

Figure 1:
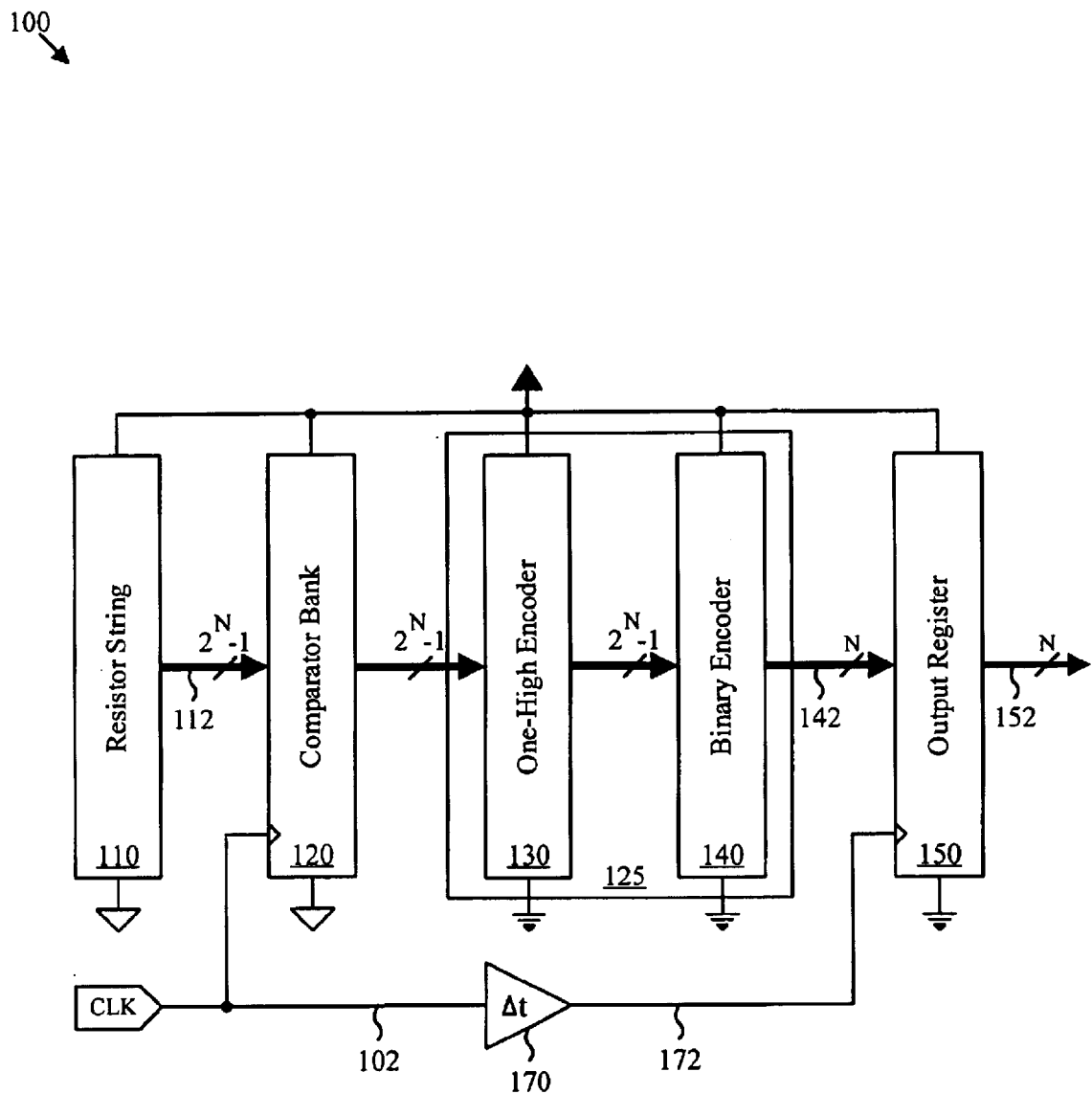
FIG. 1 is a block diagram illustrating the architecture of a classical flash A/D converter.

The sampled values stored within the latches 440 essentially provide an overdrive voltage thermometer code 442. In the depicted embodiment, the thermometer code 442 is inverted in comparison to the thermometer code presented in the background section in that the code contains zeros to the transition point and ones thereafter. A digital encoder 450 converts the thermometer code 442 to a digital code 452 and may comprise a one-high encoder and a binary encoder similar to those depicted within the digital encoder 125 of FIGS. 1 and 2.

A single-bit version of the response-pattern interpolator 320b depicted in FIG. 4b is greatly simplified in that no digital encoding is required. The single-bit version may be embodied with a single delay element 430 and a single latch 440. The response signal 312 is sampled at the appropriate time and stored within the latch 440. The latch 440 provides the sampled signal as a single additional bit 322.

Due to the elegance and simplicity of the concepts involved, one skilled in the art will appreciate that a wide variety of embodiments may capture the spirit and intent of the present invention. The scope of the invention is intended to include a novel concept—interpolation based on the time-dependent response characteristics of comparators. While the presented embodiments focuses on comparator response time, due to the simplicity of detecting and processing response time via basic latches and digital logic, other perhaps more complex embodiments may be readily derived by those of skill in the art based on the particular application and the characteristics of the comparators involved.

While the foregoing embodiments offer greatly increased functionality over existing A/D conversion techniques, one skilled in the art will also appreciate that adding response-based interpolation circuitry to each comparator may not be desirable in certain applications. What is needed is a method and apparatus of leveraging the response characteristics of comparators in a shared manner. Preferably, such an apparatus and method would be compatible with existing comparator architectures and techniques.

Figure 5:
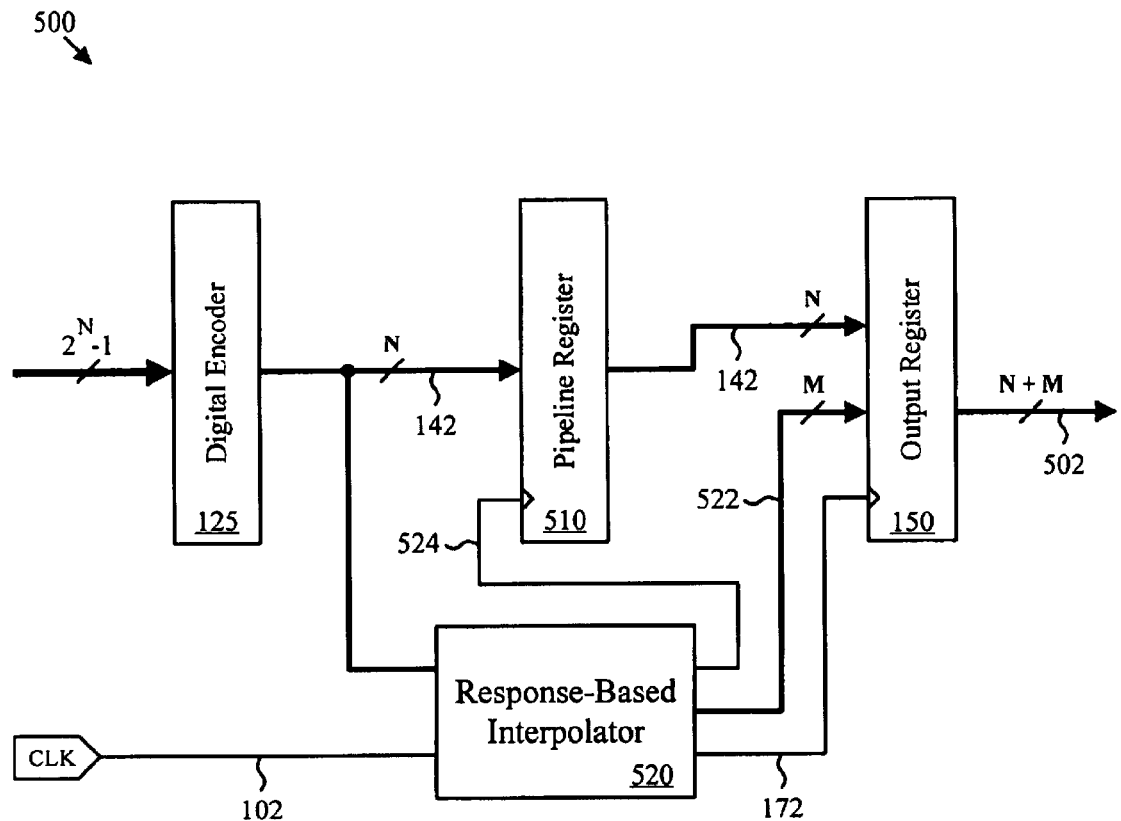
FIG. 5 is a schematic block diagram illustrating one embodiment of a response-based interpolation apparatus of the present invention.

Referring to FIG. 5, an overdrive estimator 500 is designed to work in conjunction with an analog-to-digital converter core such as the classical flash architecture 100 described in the background section above. The overdrive estimator 500 includes a digital encoder such as the digital encoder 125 described above, a pipeline register 510, a response-based interpolator 520, and an output register such as the output register 150 described above. The overdrive estimator 500 was developed to provide additional bits 522 in a shared manner to the classical flash architecture 100, though the intent of the invention may be applied to other appropriate A/D conversion architectures—particularly those based on comparators.

The response-based interpolator 520 receives a digital code such as the digital code 142, along with a timing or clock signal, such as the conversion clock 102. The response-based interpolator 520 in turn provides one or more additional bits 522. To function seamlessly within existing architectures, the response-based interpolator 520 may also provide a pipeline clock signal 524 and the delayed conversion clock signal 172. The pipeline clock signal 524 is used to latch the pipeline register 510, while the delayed conversion clock signal 172 is used to latch the output register 150.

One of experience in the art will appreciate the value of placing response-based interpolation circuitry after the digital encoder 125. Typically, the digital encoder 125 reduces the $2^N-1$ outputs of the comparator bank 120 (not shown) to N (or slightly more than N) bits within the digital code 142. The task of monitoring the digital code 142 may be performed by a single response-based interpolation circuit such as the response-based interpolator 520.

Figure 2:
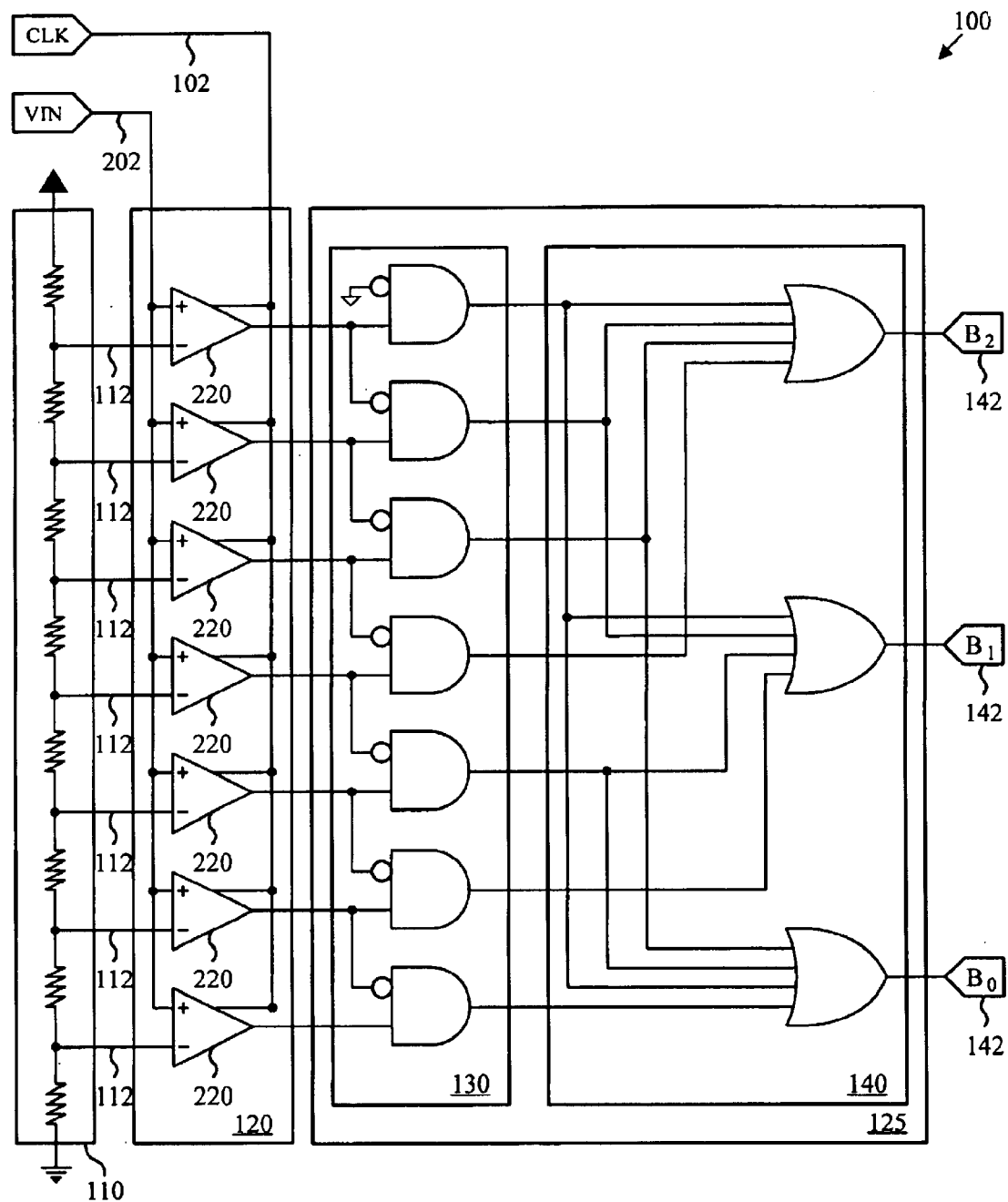
FIG. 2 is a schematic diagram illustrating one embodiment of a prior art 3-bit flash A/D converter.

Referring to FIG. 2 along with the following description will better illustrate the relationship between the response characteristics of the comparators 220 and the settling characteristics of the digital encoder 125. The following description is merely illustrative in that many variations in circuit components and configuration exist within presently available A/D converters.

As described in relation to the comparator 310 of FIG. 3a, the comparators 220 may be designed or configured to have a default state that, in the current depiction, is a low voltage. With such an arrangement, those comparators with reference voltages 112 above the voltage of the input signal 202 remain in a default state and do not transition to a high voltage during the conversion cycle. Those comparators with reference voltages 112 below the voltage of the input signal 202 experience an overdrive voltage. The overdrive voltage varies from relatively large values, for those comparators with relatively low reference voltages, to relatively small values near the thermometer transition point.

Given that the response time of a comparator increases with decreasing overdrive voltage as discussed with relation to FIG. 3c, the outputs of the comparator bank 120, in the configuration depicted in FIG. 2, will ideally transition from a low to a high state in sequential order, beginning at the bottom of FIG. 2. Given proper circuit design and process control, the last comparator output to transition will be the output corresponding to the comparator 220 with the smallest positive overdrive voltage. The last comparator output transition also causes the digital code 142 to change as digital encoder 125 changes the digital code 142 to a final value. Thus the final transition in the digital code 142 corresponds to the overdrive voltage of the last transitioning comparator. In certain embodiments particularly those where the digital encoder 125 provides digital codes that are binary, the final transition always includes a transition in the least significant bit.

Returning to FIG. 5, the overdrive estimator 500 includes the pipeline register 510. The pipeline register 510 was not described in the classical flash architecture 100, although such a register may be present, particularly in those embodiments that are double buffered to increase throughput. The pipeline register 510 is preferably included in certain embodiments on the overdrive estimator 500 in order to achieve high throughput and to synchronize the flow of the digital code 142 with the additional bits 522.

In the depicted embodiment, the digital code 142 arrives in phase with the additional bits 522 at the output register 150. The output register 150 latches the digital code 142 with the additional bits 522 as directed by the delayed conversion clock 172. The output register 150 provides the latched bits as an augmented digital code 502.

Figure 6A:
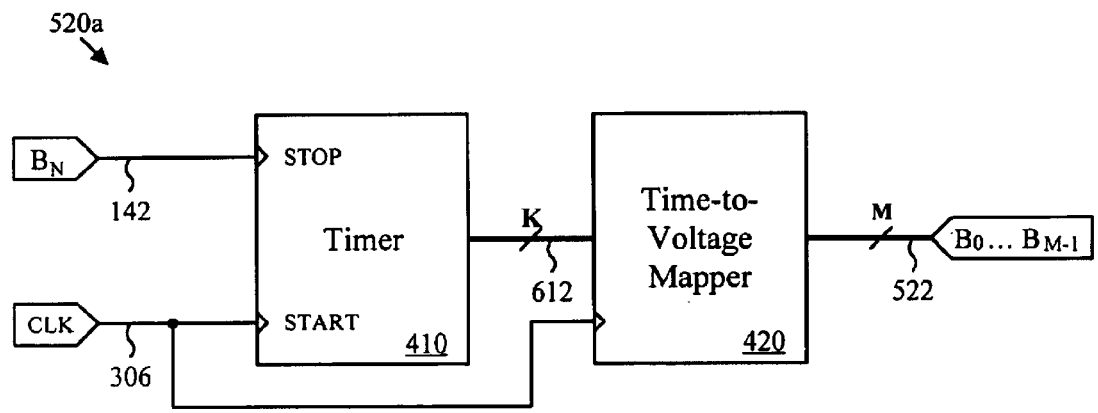
FIG. 6a is a schematic block diagram illustrating one embodiment of a settling-time interpolator of the present invention.

Referring to FIG. 6a, a settling-time interpolator 520a is essentially identical to the response-time interpolator 320a described in conjunction with FIG. 4a. However, the settling-time interpolator 520a is configured to receive the least significant bit of the digital code 142 rather than the response signal 312. The settling-time interpolator 520a detects the settling duration of the least significant bit of the digital code 142 and provides a K-bit settling time 612. The settling time 612 is mapped by the time-to-voltage mapper 420 to provide an estimate of the overdrive voltage in the form of the additional bits 522.

Figure 6B:
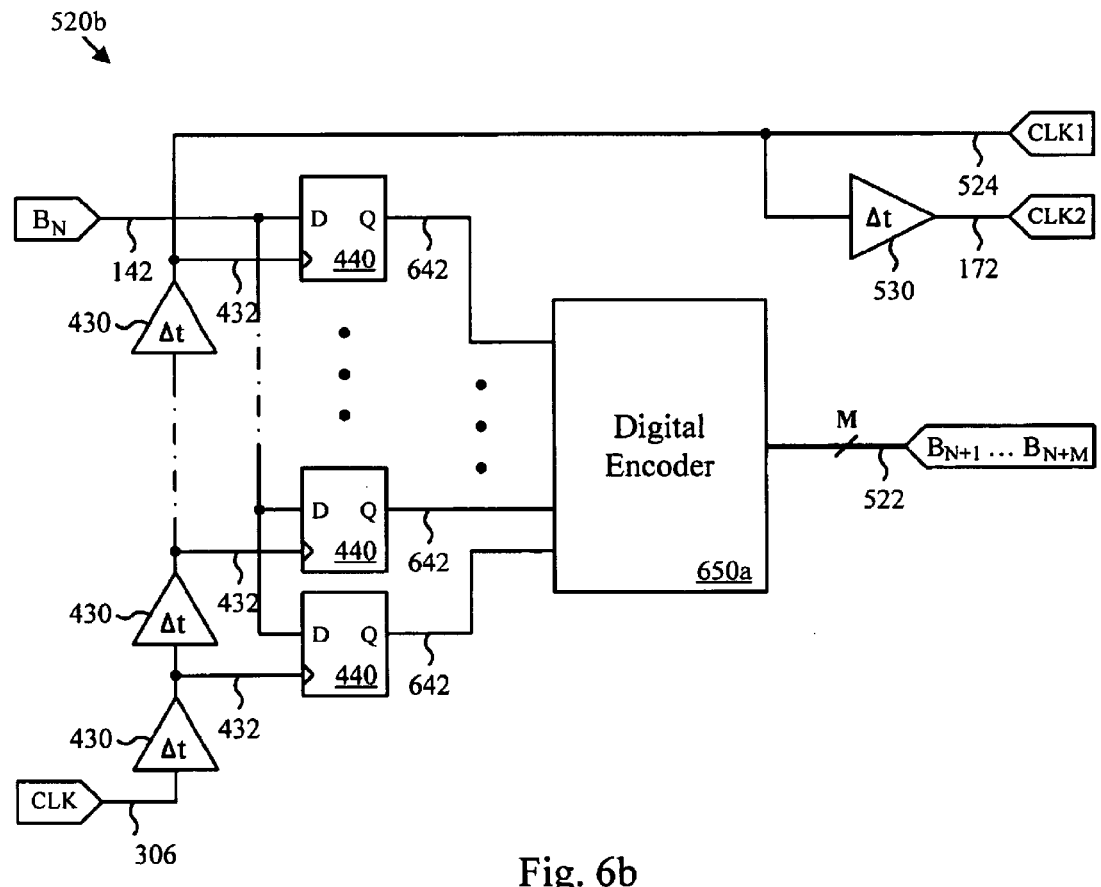
FIG. 6b is a schematic block diagram illustrating one embodiment of a settling pattern interpolator of the present invention.

Referring to FIG. 6b, a settling-pattern interpolator 520b is nearly identical to the response-pattern interpolator 320b described in conjunction with FIG. 4b. In addition to the elements described in conjunction with FIG. 4b, the settling-pattern interpolator 520b includes an additional delay element 530. The additional delay element 530 provides a delayed version of the conversion clock 306 as the delayed conversion clock 172.

While the elements are essentially identical, the settling-pattern interpolator 520b receives the least significant bit of the digital code 142 rather than the response signal 312. Furthermore, the pattern stored within, and provided by, the latches 440 is typically not a thermometer code 442. Rather, the pattern is preferably a settling code 642. A digital encoder 650a is configured to map the last bit transition within the settling code 642 to an estimated overdrive voltage represented by the additional bits 522. To capture a bit transition, a plurality of latches 440 and delay elements 430 are required.

Figure 7A:
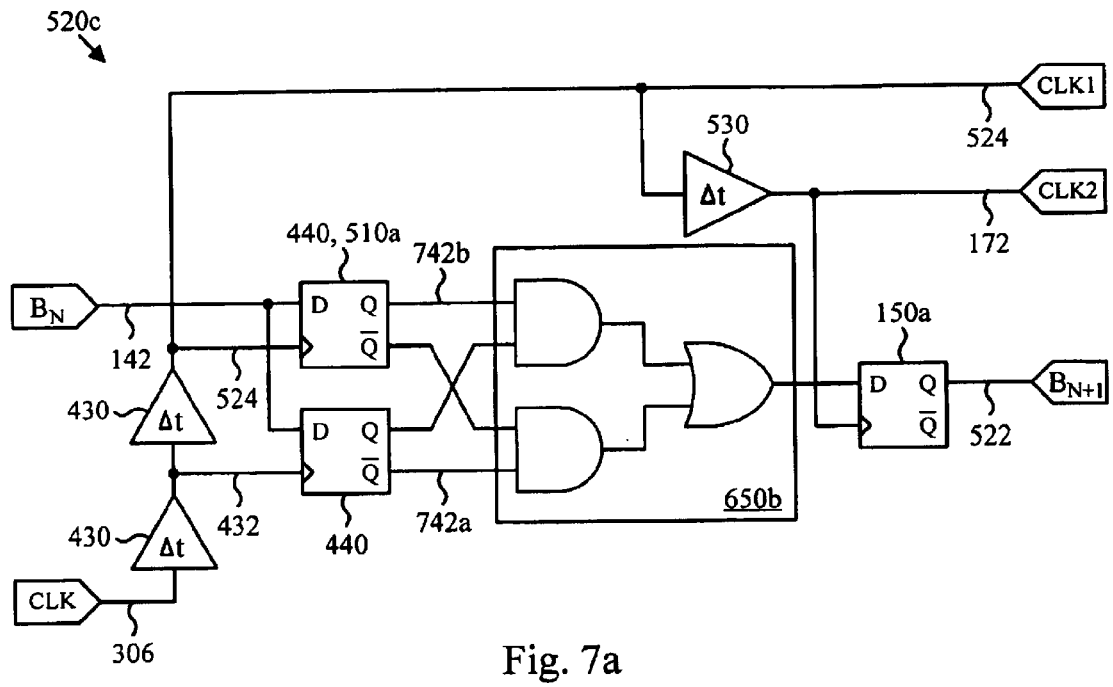
FIG. 7a is a schematic block diagram illustrating one embodiment of a single-bit settling-time interpolator of the present invention.

A simplified embodiment of the settling-pattern interpolator 520b is shown in FIG. 7a as the settling-time interpolator 520c. While the settling-pattern interpolator 520b may be a multi-bit interpolator, the depicted settling-pattern interpolator 520c is restricted to a single bit. The depicted embodiment includes two delay elements 430, another delay element 530, two sampling latches 440, an output latch 150a, and a digital encoder 650b. One of the sampling latches 440 may function as a bit within the pipeline register 510, and is shown as a pipeline latch 510a. The depicted simplified embodiment is a specific form of the settling-time interpolator 520b shown in FIG. 6b.

The sampling latches 440 capture an early sample 742a and a late sample 742b of the least significant bit of the digital code 142. The early and late samples 742a and 742b are provided to the digital encoder 650b. In the depicted embodiment, the digital encoder 650b is essentially an XOR circuit designed to detect whether the early and late samples are the same. Early and late samples that are the same indicate an early comparator output transition and a relatively high overdrive voltage.

The output of the digital encoder 650b is clocked into the output latch 150a at the appropriate time to provide an additional bit 522. The output latch 150a is an extension of the output register 150, while latch 510a is an extension of the pipeline register 510. In the depicted embodiment, as well as other embodiments, storing the least significant bits of the pipeline register 510 and the output register 150 within the response-based interpolator 520 reduces circuit complexity.

Figure 7B:
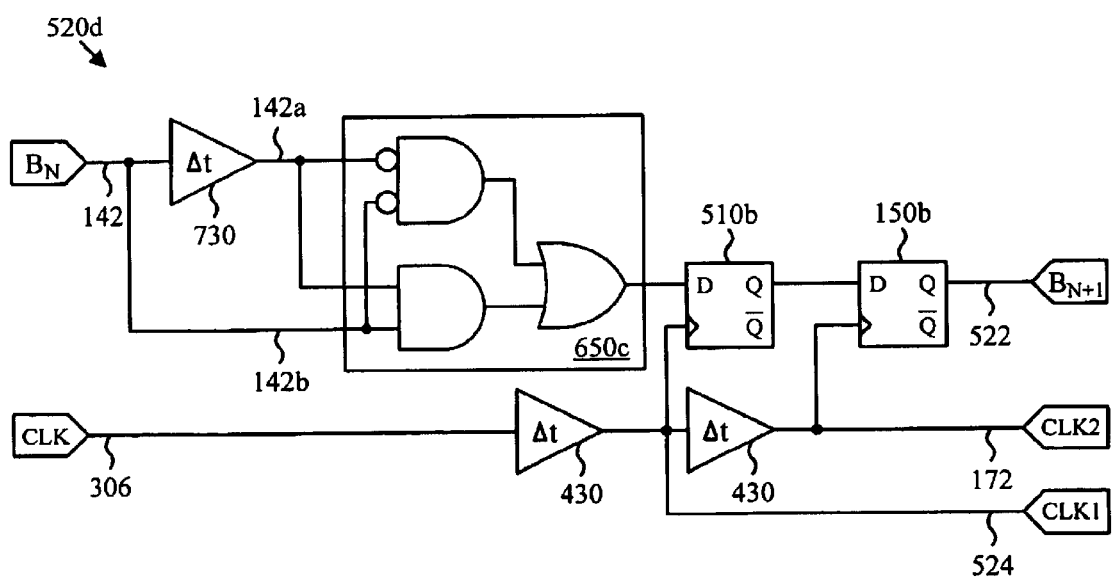
FIG. 7b is a schematic block diagram illustrating an alternative embodiment of a single-bit settling-time interpolator of the present invention.

An alternative simplified embodiment of the settling-pattern interpolator 520b is shown in FIG. 7b as the settling-pattern interpolator 520d. The depicted embodiment includes two delay elements 430, a pipeline latch 510b, an output latch 150b, and a digital encoder 650c. The settling-time interpolator 520d utilizes a delay element 730 on the least significant bit of the digital code 142 to provide an early bit 142a and a late bit 142b.

The digital encoder 650c is similar to the digital encoder 650b in that an XOR function is performed by the unit. However, the settling-time interpolator 520d performs the XOR function on the early bit 142a and the late bit 142b rather than on the latched samples 742a and 742b. The pipeline latch 510b, and the output latch 150b are essentially extensions to the pipeline register 510 and the output register 150 respectively. In reduced throughput applications where the timing requirements may be relaxed, the settling-pattern interpolator 520d may be preferred in that the pipeline register 510 and the pipeline latch 510a are not needed for proper performance and may be omitted along with one of the delay elements 430.

The various embodiments of the response-based interpolator 520 leverage the time-dependent response characteristics of comparators to add additional bits of conversion resolution to a converter core. In certain embodiments, the lowest valued code of the converter core corresponds to a signal region wherein no comparator responds to the input signal. In those embodiments, no additional bits of conversion resolution are added within that signal region. One solution to missing the additional resolution bits at the low-end codes is to add another comparator to the converter core corresponding to the lowest reference voltage. Another solution is to ignore the missing codes in that the missing codes correspond to an extreme end of the input signal range.

It should be noted that many architectural and design variations to the described invention are possible and will be readily apparent to one of skill in the art. One typical variation involves selection of the reference voltages in order to achieve specific design objectives such as rounding. The presented embodiments are intended to communicate the flexibility and usefulness of the present invention. The present invention may be embodied in other specific forms without departing from its spirit or essential characteristics. All changes that come within the meaning and range of equivalency of the claims are to be embraced within their scope. The described embodiments are to be considered in all respects only as illustrative and not restrictive.

The scope of the present invention is intended to include a novel concept—interpolation based on the time-dependent response characteristics of comparators. Many implementations and embodiments are possible within the aforementioned scope. Details and specifications such as conversion speed, conversion resolution, conversion architecture, process technology, gate speed, fan out, and the like may have significant impact on the selected or preferred embodiments. The application and technology constraints inherent in engineering devices and systems, particularly in the present art, impose adaptation which, due to the simplicity of the present invention, may generate a wide variety of embodiments that nevertheless remain within the intended scope of the claims.

What is claimed is:

1. An apparatus for increased analog-to-digital conversion resolution, the apparatus comprising:

an analog-to-digital converter configured to convert an analog signal to digital values comprising a plurality of bits; and an interpolator configured to detect a response time of at least one analog comparator within the analog-to-digital converter core and thereby provide at least one additional bit to the plurality of bits.

2. The apparatus of claim 1, wherein the interpolator is further configured to provide the at least one additional bit at a rate substantially equal to a conversion rate of the analog-to-digital converter.

3. The apparatus of claim 1, wherein the response time of the at least one analog comparator is detected by detecting a settling pattern of at least one bit of the plurality of bits.

4. The apparatus of claim 1, wherein the response time of the at least one analog comparator is detected by detecting a settling time of at least one bit of the plurality of bits.

5. A method for increased analog-to-digital conversion resolution, the method comprising:

converting an analog signal to digital values comprising a plurality of bits with an analog-to-digital converter;

detecting a response time of at least one analog comparator within the analog-to-digital converter core to provide at least one additional bit to the plurality of bits.

6. The method of claim 5, wherein the at least one additional bit is provided at a rate substantially equal to a conversion rate of the analog-to-digital converter.

7. The method of claim 5, wherein the response time of the at least one analog comparator is detected by detecting a settling pattern of at least one bit of the plurality of bits.

8. The method of claim 5, wherein the response time of the at least one analog comparator is detected by detecting a settling time of at least one bit of the plurality of bits.

* * * * *